(12) United States Patent
Yeh

(10) Patent No.: US 6,507,389 B1
(45) Date of Patent: Jan. 14, 2003

(54) PHOTOLITHOGRAPHY SYSTEM HAVING A FREQUENCY DOMAIN FILTERING MASK

(75) Inventor: Chin-Teh Yeh, Taipei (TW)

(73) Assignee: Promos Technologies, Inc., Hsinchu (TW)

( * ) Notice: Subject to any disclaimer, the term of this patent is extended or adjusted under 35 U.S.C. 154(b) by 0 days.

(21) Appl. No.: 09/545,037

(22) Filed: Apr. 7, 2000

(51) Int. Cl.[7] .................. G03B 27/72; G03B 27/42; G03B 27/52
(52) U.S. Cl. .................. 355/71; 355/53; 355/55; 355/67
(58) Field of Search .................. 355/53, 67, 68, 355/69, 71, 77, 55; 430/5, 20, 22, 30, 311

(56) References Cited

U.S. PATENT DOCUMENTS

| | | | | |
|---|---|---|---|---|
| 5,055,871 A | * | 10/1991 | Pasch | 355/53 |
| 5,316,896 A | * | 5/1994 | Fukuda et al. | 355/71 |
| 5,467,166 A | * | 11/1995 | Shiraishi | 355/53 |
| 5,642,183 A | * | 6/1997 | Sugihara et al. | 355/53 |
| 5,677,757 A | * | 10/1997 | Taniguchi et al. | 355/53 |
| 6,151,103 A | * | 11/2000 | Shu et al. | 355/53 |
| 6,261,727 B1 | * | 7/2001 | Wang | 355/55 |
| 6,320,648 B1 | * | 11/2001 | Brueck et al. | 355/53 |

* cited by examiner

Primary Examiner—Alan A. Mathews
(74) Attorney, Agent, or Firm—Blakely Sokoloff Taylor & Zafman

(57) ABSTRACT

A system and method of improving a photolithography process is disclosed. A phase shift filter is placed between two lenses located between a reticle mask and a wafer. The two lenses combined with the phase-shift filter performs a adjustment of the mask image in the spatial frequency domain, projecting an image that is equivalent to the differentiation of the light intensity of the mask image, thereby reproducing a sharper defined mask pattern on the wafer.

20 Claims, 4 Drawing Sheets

PHOTOLITHOGRAPHY SYSTEM HAVING A FREQUENCY DOMAIN FILTERING MASK

BACKGROUND OF THE INVENTION

1. Field of the Invention

The present invention relates to photolithography of semiconductor devices, and more particularly, to a photolithography system having a frequency domain filter mask.

2. Background Information

Photolithography is a process that is commonly used in the manufacture of integrated circuits. The well-known process involves the deposition of a photoresist layer onto an underlying substrate layer. The photoresist is then selectively exposed to light, which chemically alters the photoresist. The photoresist is then developed and those portions of the photoresist that are exposed to light are either hardened or softened, depending upon whether or not the photoresist is "negative" or "positive" photoresist, respectively.

The pattern that is projected onto the photoresist layer is contained on a mask that is placed within the photolithography exposure tool. The mask is also referred to as a reticle mask. The most common type of photolithography exposure tool is the stepper machine. A mask is placed between the illuminating light and the photoresist. The reticle is typically formed from patterned chromium coated on glass or quartz. The pattern is transferred onto the photoresist by projecting an image of the mask onto the photoresist.

As features on the mask become closer and closer together, diffraction effects begin to appear when the width of the openings on the mask is comparable to the wavelength of the light source. The diffraction effect blurs the light image projected onto the photoresist, resulting in poor resolution. The pattern formed on the photoresist layer will not be an exact replica of the pattern on the reticle mask, producing errors in the manufacturing process. One prior art method of preventing diffraction patterns from interfering with the desired patterning of the photo-resist is to cover selected openings in the mask with a transparent layer that shifts one of the sets of exposing rays out of phase, which will null the interference pattern. This approach is referred to as a phase shift mask.

FIG. 1 shows a prior art phase shift mask. The phase shift mask has parts of the openings in the photoresist layer covered by a phase-shifting layer. This generally requires the deposition of a layer of silicon dioxide onto the mask or reticle and a photomasking process to remove the oxide layer from alternate patterns. Covering every other opening works well for repeated array patterns such as logic and memory products.

Nevertheless, use of the phase shift mask has several disadvantages. First, the design of a phase shift mask is a relatively complicated procedure that requires significant resources. Secondly, because of the nature of a phase shift mask, it is difficult to check whether or not defects are present in the phase shift mask.

Therefore, what is needed is a new method of providing the high resolution capabilities of a phase shift mask using a simpler approach.

SUMMARY OF THE INVENTION

A system and method of improving a photolithography process is disclosed. A phase-shift filter is placed between two focusing lenses located between a reticle mask and a wafer. The two focusing lenses combined with the phase-shift filter performs an amplitude and phase adjustment of the mask image in the spatial frequency domain, projecting an image that is equivalent to the differentiation of the light intensity of the mask image onto the wafer, thereby more accurately reproducing the mask pattern on the wafer.

BRIEF DESCRIPTION OF DRAWINGS

The present invention will be described in conjunction with the following drawings, wherein.

DETAILED DESCRIPTION OF THE INVENTION

The present invention uses a first focusing lens, a phase-shift filter, and a second focusing lens to produce a replicate image of a mask pattern with sharper defined edges on a semiconductor wafer. The mask pattern is formed on a reticle mask, or photolithographic mask. The term "lens" will generally refer to a "focusing lens" hereinafter. The light emitting from a light source passes though the reticle mask, the first lens, the phase-shift filter, the second lens, and then projects an image of the mask pattern onto the wafer. The first lens produces a Fourier-transformed image of the mask pattern. The phase-shift filter adjusts the phase and amplitude of the Fourier-transformed image to produce an "adjusted Fourier-transformed" image. The second lens produces an inverse-Fourier transformed image of the adjusted Fourier-transformed image, which is then projected onto the wafer. As will be described below in more detail, the inverse-Fourier transform of the adjusted Fourier-transformed image is an accurate replica of the original mask pattern with sharply defined edges.

The openings of a mask that defines the mask pattern can be characterized as slits. When the slit widths on the mask are comparable to the wavelength of the light source, diffraction will occur when the light passes through the slits on the mask and onto the wafer. Due to diffraction, the image of the slit (slit image) formed on the wafer is blurred at the edges. The light intensity will be higher near the center of the slit image, decreasing gradually at the edges. Thus the boundaries of the slit image will not be clearly defined. By performing a differentiation operation on the light intensity pattern formed after the light passes through the mask, the edges of the image projected onto the wafer can be sharpened, resulting in a more clearly defined image. The differentiation operation of the light intensity pattern is achieved by utilizing a phase-shift filter to adjust the amplitude and phase of the image in the frequency domain.

Fourier Analysis

Figure 1:
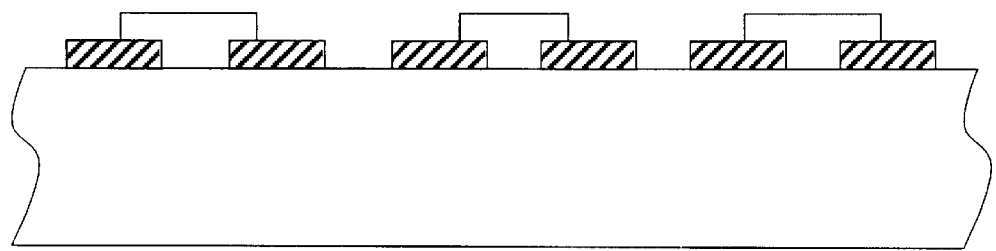
FIG. 1 is a schematic drawing of a prior art phase-shift mask.
Figure 2:
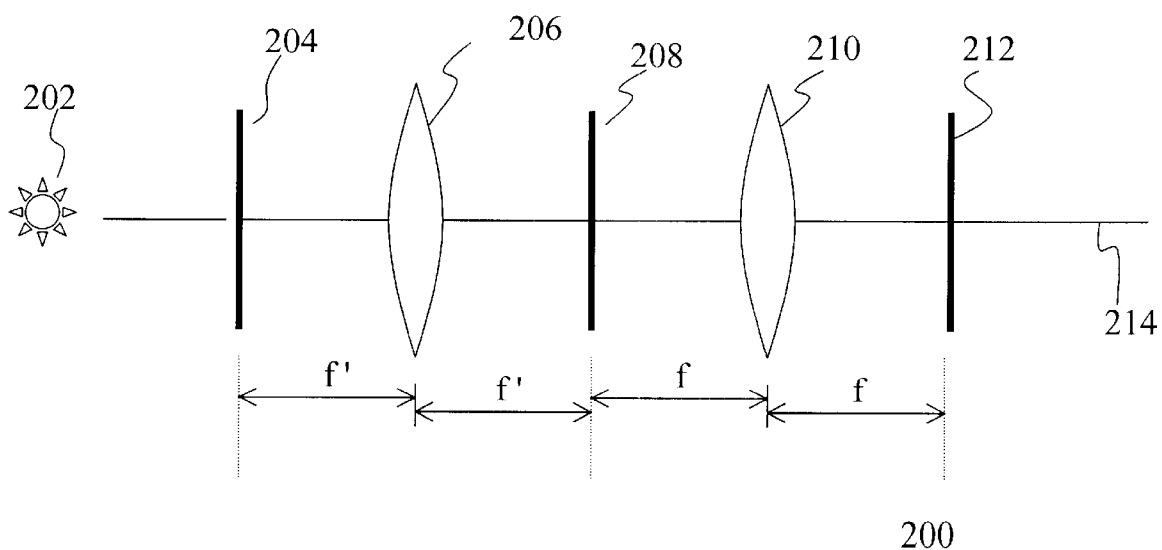
FIG. 2 is a schematic diagram of a lens pair for transforming an image in the spatial domain to the spatial frequency domain and then back to the spatial domain.

Referring FIG. 2, a light source 202, a first lens 206, and a second lens 210 are aligned along the optical axis 214 of the first and second lenses 206 and 210. The focal length of the first lens 206 is equal to f, and the focal length of the second lens 210 is equal to f. The first lens 206 has a front focal plane 204 and a back focal plane. The front direction refers to the direction towards the light source 202. The second lens 210 has a front focal plane and a back focal plane 212. The back focal plane of the first lens and the front focal plane of the second lens coincide at a spatial frequency plane 208.

For purpose of illustration, assume that the x-axis is the horizontal axis, the y-axis is the vertical axis, and the z-axis is the optical axis 214. A two-dimensional pattern u(x, y) is placed at the front focal plane 204. According to Fourier optics theory, the image formed at the spatial frequency plane 208 is the two-dimensional Fourier transform of u(x, y), which is represent by the formula U(fx, fy). The symbols fx, fy represent the coordinates on the spatial frequency plane. The relationship between the u(x, y) and U(fx, fy) can be written as:

$$U(fx, fy) = F[u(x, y)] \quad \text{(Equ. 1)}$$

The notation F[ ] represents the Fourier transform operator.

When the image U(fx, fy) passes through the second lens 210 and is projected on the back focal plane 212, the image at the back focal plane 212 will be the inverse-Fourier transform of the image formed at the spatial frequency plane 208. If nothing is placed at the spatial frequency plane 208 to alter the amplitude and phase of the image at spatial frequency plane 208, then the image projected on the back focal plane 212 is just the original pattern u(x, y). This is because the inverse-Fourier transform of a Fourier-transformed image is the same image itself. This can be written as:

$$F^{-1}[F[u(x, y)]] = u(x, y)$$

The notation $F^{-1}[\ ]$ represents the inverse-Fourier transform operator.

According to Fourier transformation theory, the Fourier transform of the derivative of u(x, y) is proportional to (fx+fy)·U(fx, fy), and can be expressed as:

$$F[u'(x, y)] = 2\pi \cdot (fx+fy) \cdot \exp(j\pi/2) \cdot U(fx, fy) \quad \text{(Equ. 2)}$$

Thus if a phase-shift filter is placed at the spatial frequency plane 208, such that the phase and amplitude of the image at the spatial frequency plane 208 is modified by an amount of "2π·(fx+fy)·exp(jπ/2)", then the image formed at the back focal plane 212 will be the derivative of the light intensity pattern at the front focal plane 204.

In the above formulas, the derivative of the pattern u(x, y) is taken along both the x-direction and the y-direction. If the only the diffraction effects along the x-direction needs to be considered, then the equations above can be simplified by taking out the fy components. Such situation occurs when the pattern u(x, y) has features in the x-direction that are comparable to the wavelength of the light source 202, and the features along the y-direction are larger than one wavelength. Since the diffraction effect is significant only in the x-direction, differentiation of the image is required only in the x-direction, and the equations above can be simplified:

$$F[u'(x, y)] = F[d(u(x, y))/dx] = 2\pi \cdot fx \cdot \exp(j\pi/2) U(fx, fy). \quad \text{(Equ. 3)}$$

The derivative of a pattern will enhance the parts of the pattern that changes rapidly. Typically, the edges of the pattern are the places where there are significant changes. Thus the derivative of an image with blurred edges will result in an image having a similar pattern as the original but with more sharply defined edges. One embodiment of this invention uses a pair of lenses and a phase-shift filter to generate the derivative of a photolithography mask pattern, thereby reducing the distortion caused by the diffraction effect.

Photolithography Using Phase-Shift Filter in the Spatial Frequency Plane

Figure 3:
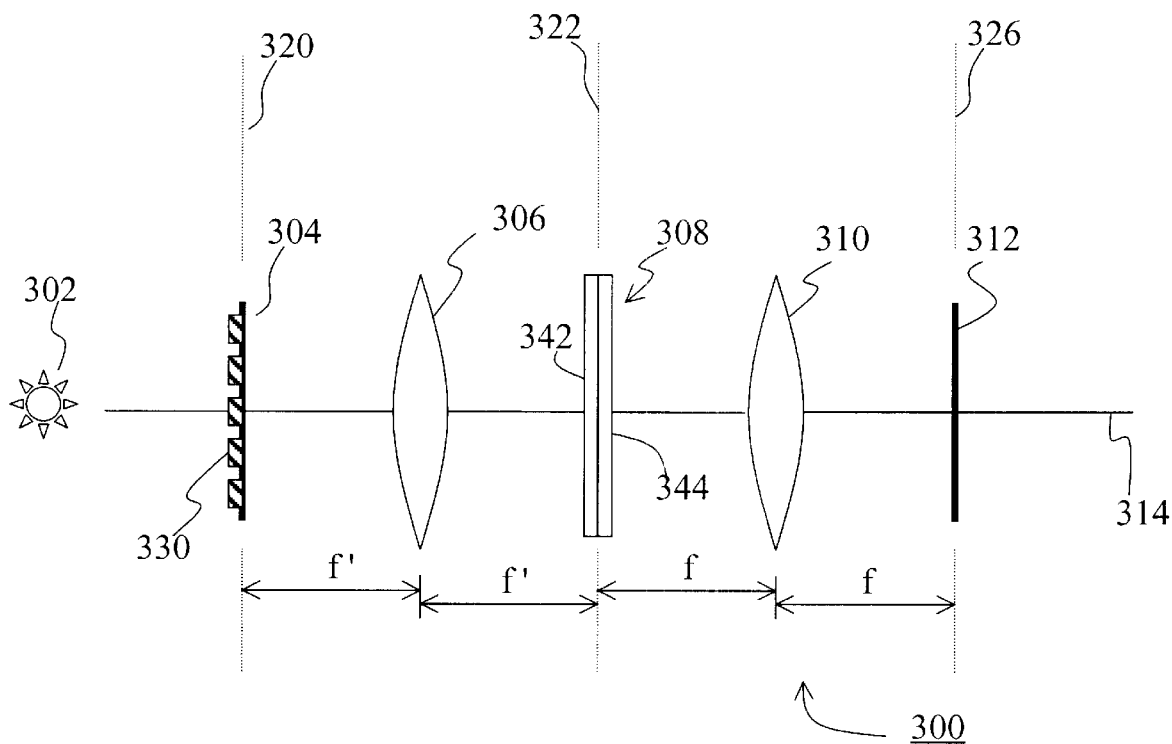
FIG. 3 is a schematic diagram of an optical system formed in accordance with the present invention.

Turning to FIG. 3, a schematic illustration of an embodiment of the present invention is shown. A photolithography system 300 includes a light source 302, a reticle mask 304, a first lens 306, a phase-shift filter 308, a second lens 310, and a wafer 312 that are all aligned along the optical axis 314. The reticle mask 304, first lens 306, phase-shift filter 308, second lens 310, and the wafer 312 are placed perpendicularly to the optical axis 314. The light source 302 is typically an ultraviolet (UV) or deep ultraviolet (DUV) light source, although it may be any type of radiation source normally used in photolithography. An example of the light source 302 is a KrF laser emitting DUV radiation with a wavelength of 2480 angstrom.

Preferably, the reticle mask 304 is formed by chromium on quartz in accordance with conventional techniques, and has a width of about 15 cm. The reticle mask 304 carries the mask pattern 330 that is desired to be imprinted onto the wafer 312. The wafer 312 is typically coated with a photoresist layer, so that after the photolithography process, a replica of the mask pattern is formed on the photoresist layer on the wafer 312. The reticle mask 304, the first lens 306, the phase-shift filter 308, the second lens 310, and the wafer 312 are mounted on a support frame of the photolithographic machine that is not shown in the figure. The support frame has adjustment mechanisms so that the distances between the reticle mask 304 and the first lens 306, between the first lens 306 and the phase-shift filter 308, between phase-shift filter 308 and the second lens 310, and between the second lens 310 and the wafer 312, can all be fine tuned to produce the sharpest image on the wafer 312.

The focal length of the first lens 306 is f', and the focal length of the second lens 310 is f. The reticle mask 304 is situated between the light source 302 and the first lens 306. The first lens 306 has two focal planes. Define the front focal plane 320 of the first lens 306 as the one that is closer to the light source 302, and the back focal plane as the one that is farther away from the light source 302. Likewise, the second lens 310 has a front focal plane that is closer to the light source 302, and a back focal plane 326 that is farther away from the light source 302. In this embodiment, the back focal plane of the first lens 306 coincides with the front focal plane of the second lens 310, and is called the spatial frequency plane 322. This is because the image formed at the back focal plane of the first lens 306 is the Fourier transform of the image at the front focal plane 304.

In operation, light emitting from the light source 302 passes through the reticle mask 304, the first lens 306, the phase-shift filter 308, the second lens 310, and then projects an image upon the wafer 312. The first and second lenses 306 and 310 are conventional focusing optical lenses commonly used in many of the photolithography machines. Preferably, the lens has an effective exposure diameter of 30 cm. The phase-shift filter 308 is situated at the spatial frequency plane 322. Typically, the phase-shift filter 308 has a certain thickness, and the center plane of the phase-shift filter 308 coincides with the spatial frequency plane 322. The wafer 312 is situated at the back focal plane 326 of the second lens 310.

The phase-shift filter 308 is formed from two parts: an attenuator 342 and a phase shifter 344. The attenuator 342 is made of a glass or quartz substrate and some coating material such as Ag, CrO, CrON, or MoSiON. The thickness of the attenuator 342 and the coating of the attenuator 342 is designed such that an image is modified in the fx-direction according to the formula:

$$S_1(fx, fy) = fx \cdot S_0(fx, fy)$$

$$= \begin{cases} fx \cdot S_0(fx, fy) & fx > 0 \\ fx \cdot S_0(fx, fy) \cdot \exp(j\pi) & fx < 0, \end{cases}$$

where $S_0(fx)$ is the image before passing through the attenuator 342, and $S_1(fx)$ is the image after passing through the attenuator 342. The term "exp(jπ)" is produced by adjusting the thickness of the substrate of attenuator 342 for the parts "fx<0" such that light passing through it has a phase shift equal to π. The light rays passing through the attenuator 342 at a position closer to the fy-axis has a smaller amplitude (i.e., darker), and the light rays passing farther away from the fy-axis axis has a greater amplitude (i.e., brighter). Here, the notation fx and fy are used to denote the coordinates on the spatial frequency plane 322.

The phase shifter 344 is typically made of glass, or quartz, and preferably has a refractive index of about 1.5. The phase shifter 344 shifts the phase of the image in the amount of $$\Delta\Phi = (2\pi/\lambda) \cdot a \cdot (n-1) \tag{Equ. 4}$$

where ΔΦ is the amount of phase shift, "a" is the thickness of the phase shifter, "n" is the index of refraction of the phase shifter, and λ is the wavelength of the light source 302. By adjusting the thickness of the phase shifter 344 (the thickness will depend on the wavelength of light source used), an amount of phase shift equal to π/2 can be achieved.

The combined effect of the attenuator 342 and the phase shifter 344 is to change the amplitude and phase of an incident image according to the formula:

$$S_2(fx, fy) = 2\pi \cdot fx \cdot \exp(j\pi/2) \cdot S_0(fx, fy) \tag{Equ. 5}$$

Where $S_2(fx, fy)$ is the image formed after passing through the phase-shift filter 308. The term "2π" is just a constant and can be achieved by adjusting the overall opacity of the attenuator. Preferably, the combined thickness of the substrate of the attenuator 342 and the phase shifter 344 is adjusted such that light rays passing through the phase-shift filter 308 have a phase shift of π/2 in the region "fx>0", and have a phase shift of 3π/2 in the region "fx<0".

Figure 5:
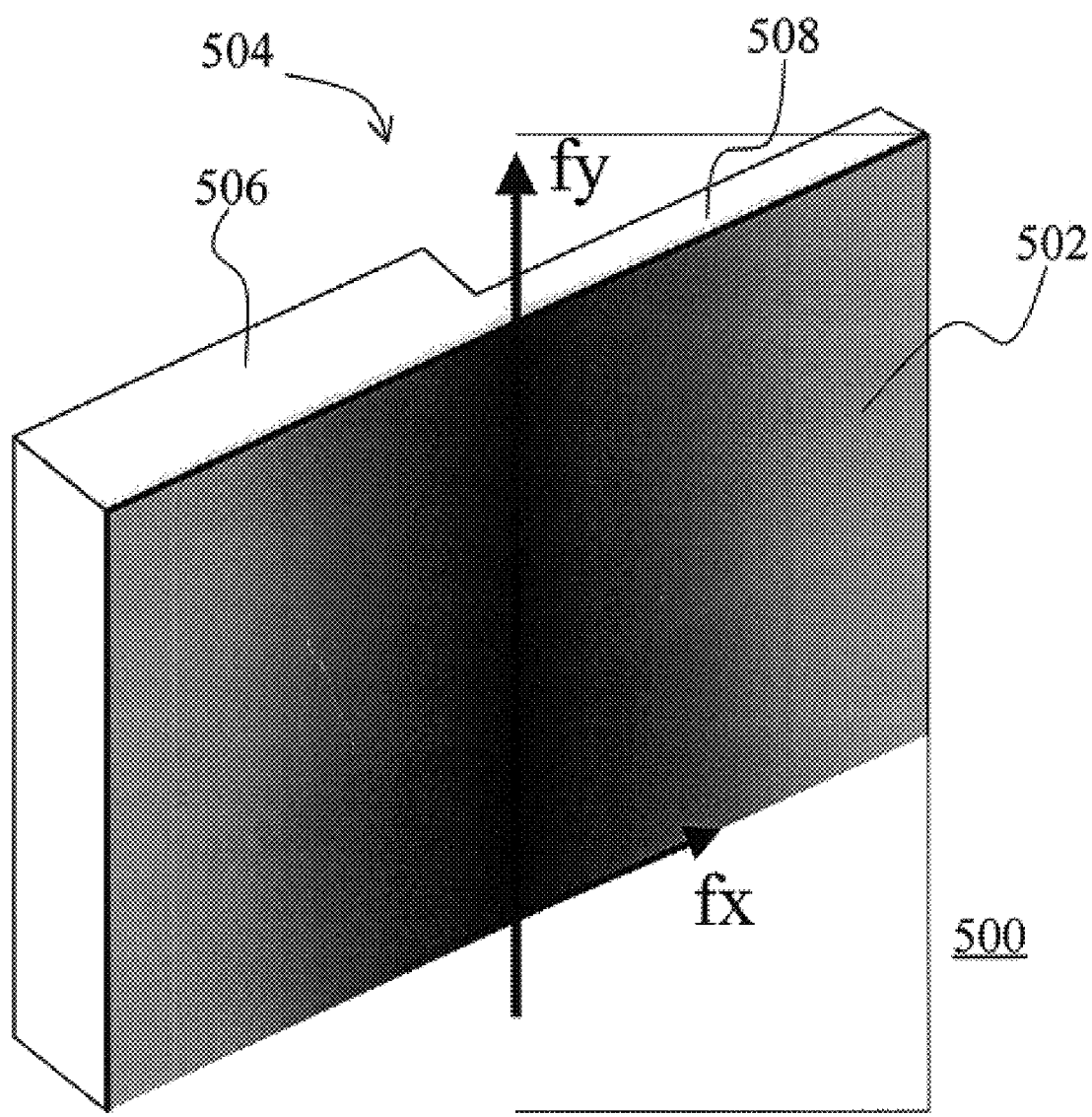
FIG. 5 is a diagram of an embodiment of a phase-shift filter.

Referring to FIG. 5, an embodiment of phase-shift filter 500 comprises an attenuator 502 formed on a substrate 504. The attenuator is preferably a coating made of Ag, CrO, CrON, or MoSiON. The substrate 504 is comprised of a first phase-shift portion 506 in the region "fx<0", and a second phase-shift portion 508 in the region "fx>0". The thickness of the first phase-shift portion 506 is designed such that the light rays passing through the first phase-shift portion 506 have a phase shift of 3π/2. The thickness of the second phase-shift portion 508 is designed such that the light rays passing through the second phase-shift portion 508 have a phase shift of π/2. The coating 502 is opaque on the fy-axis (thus allowing no light to pass through), and gradually becomes more transparent as |fx| becomes larger (thus allowing more light to pass through). An image passing through the coating 502 is modified in the fx-direction according to the formula:

$$S_3(fx, fy) = |fx| \cdot S_2(fx, fy),$$

where $S_2(fx)$ is the image before passing through the attenuator 502, and $S_3(fx)$ is the image after passing through the attenuator 502.

According to Fourier Optics theory, the image produced at the back focal plane of the first lens 306 (which is the spatial frequency plane 322) is the Fourier transform of the image at the front focal plane 320. Assuming that the thickness of the phase-shift filter 308 is small compared with the focal length f, the image projected onto the front end of the phase-shift filter 308 is the Fourier-transformed image of the mask pattern of the reticle mask 304. The phase-shift filter 308 changes the amplitude and phase of the Fourier-transformed image according to Equation 5, and produces an "adjusted Fourier-transformed" image of the mask pattern. The image formed on the back focal plane 326 of the second lens 312 is the inverse-Fourier transform of the image at the front focal plane of the second lens 310 (which is the spatial frequency plane 322). Thus, the image projected onto the wafer 312 is the inverse-Fourier transform of the adjusted Fourier-transformed image of the mask pattern.

Assume that the reticle mask 304 has a two-dimensional mask pattern 330 that is described as u(x, y). The image u(x, y) is situated at the front focal plane 320 of the first lens 306. The Fourier-transformed image at the front end of the phase-shift filter 308 is $U_0(fx, fy)$, where fx, fy are the coordinates on the spatial frequency plane 322. The image formed after passing through the phase-shift filter is $U_1(fx, fy)$, and according to Equation 5, $U_1(x, y) = 2\pi \cdot fx \cdot \exp(j\pi/2) \cdot U_0(fx, fy)$. According to Equation 3, $U_1(fx, fy)$ is substantially the same as F[u'(x, y)], which is the Fourier transform of the derivative of u(x, y) along the x-direction (i.e., d u(x, y)/dx).

The back end of the phase-shift filter 308 is near the front focal plane of the second lens 310 (under the assumption that the thickness of the phase-shift filter 308 is small compared with the focal lengths f' and f). According to Fourier Optics theory, the image projected on the back focal plane 326 is the inverse Fourier transform of the image at the front focal plane of the second lens 310. The image projected at the back focal plane 326 is $F^{-1}[F[u'(x, y)]]$, which is just u'(x, y). Therefore, the image projected upon the wafer 312 situated at the back focal plane 326 is simply the derivative of the image of the mask pattern 330. Here, the derivative of the image means the derivative of the light intensity of the image. The derivative of an image will have sharper edge patterns. Therefore, the combination of the first lens 306, phase-shift filter 308, and second lens 310 has the effect of transferring the image of the mask pattern 330 onto the wafer 312 with the edges more sharply defined. The blurring due to diffraction is reduced accordingly.

Figure 4:
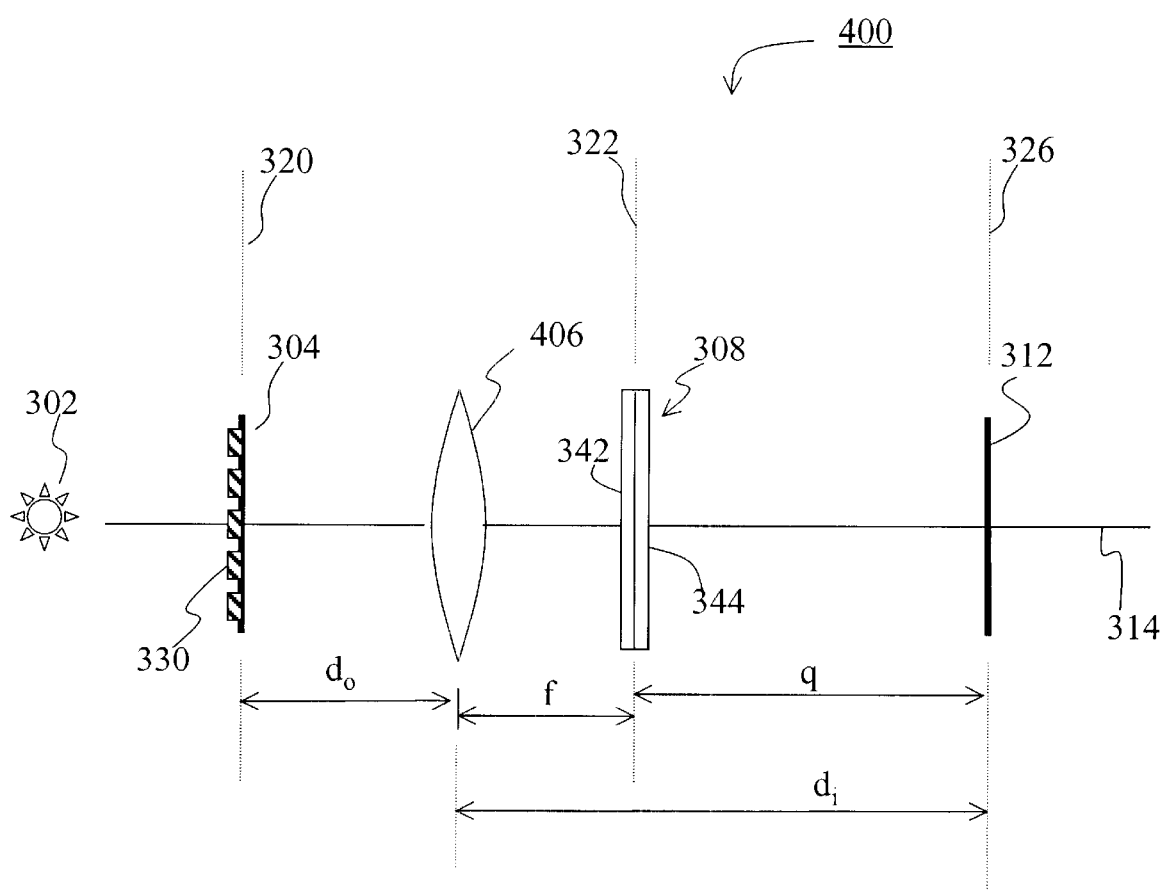
FIG. 4 is a schematic diagram of another optical system formed in accordance with the present invention.

Referring to FIG. 4, a schematic illustration of another embodiment of the present invention is shown. This embodiment eliminates one lens from the previous embodiment. The distances between various components are also adjusted. A photolithography system 400 includes the light source 302, the reticle mask 304, a lens 406, the phase-shift filter 308, and the wafer 312 that are all aligned along the optical axis 314. The reticle mask 304, lens 406, phase-shift filter 308, and the wafer 312 are placed perpendicularly to the optical axis 314. The reticle mask 304, the lens 406, the phase-shift filter 308, and the wafer 312 are mounted on a support frame of the photolithographic machine that is not shown in the figures. The support frame has adjustment mechanisms so that the distances between the reticle mask 304 and lens 406, between lens 406 and phase-shift filter 308, and between phase-shift filter 308 and wafer 312, can be fine tuned to produce a sharp image on the wafer 312.

The focal length of the lens 406 is f. The reticle mask 304 is situated between the light source 302 and the lens 406. The distance between the reticle mask 304 and the lens 406 is $d_o$, with $d_o$ greater than the focal length f. In operation, light emitting from the light source 302 passes through the reticle mask 304, the lens 406, the phase-shift filter 308, and then projects an image upon the wafer 312. The distance between the wafer 312 and the lens 406 is $d_i$, with $d_i$ greater than the focal length f. The distances $d_o$ and $d_i$ satisfy the thin lens equation: $1/f=1/d_o+1/d_i$. The distance between the wafer 312 and the phase-shift filter 308 is q. The distance q is typically designed to be greater than 1000 times the smallest line width of the mask pattern 330.

The two-dimensional mask pattern 330 of the reticle mask 304 is described as u(x, y). According to Fourier Optics theory described previously, the image projected onto the wafer 312 is the derivative of the image of the mask pattern 330, magnified at a ratio of $d_i/d_o$. The mask is designed such that the dimension ratio of the mask pattern 330 to the pattern desired to be imprinted on the wafer is $d_o/d_i$. The combination of the lens 406 and the phase-shift filter 308 has the effect of transferring the image of the mask pattern 330 onto the wafer 312 with the edges more sharply defined. The blurring due to diffraction is reduced accordingly.

While the preferred embodiment of the invention has been illustrated and described, it will be appreciated that various changes can be made therein without departing from the spirit and scope of the invention.

What is claimed is:

1. A semiconductor photolithography system used in conjunction with a light source, a photolithography mask having a mask pattern, and a semiconductor wafer, comprising:

a first focusing lens;

a second focusing lens;

a first mount for holding the mask, said first mount situated be the light source and said first focusing lens, and at a distance away from the first focusing lens substantially equal to the focal length of said first focusing lens;

a phase-shift filter comprising an attenuator and a phase shifter, wherein said phase-shift filter is situated between said first focusing lens and said second focusing lens, said phase-shift filter used for modifying the phase and intensity of light passing through said phase-shift filter, the distance between said phase-shift filter and said first focusing lens being substantially equal to the focal length of said first focusing lens, and the distance between said phase-shift filter and said second focusing lens being substantially equal to the focal length of said second focusing lens;

wherein said attenuator is a transparent plate having a coating thereon of varying opacity, such that the opacity of said attenuator varies gradually from opaque to semi-transparent to transparent according to a predetermined pattern, and wherein said costing is uniform along a first direction on the surface of said plate, and changes opacity along a second direction on the surface of said plate, said phase-shift filter being opaque at the center of said plate along said second direction, and gradually becoming transparent toward the edges of said plate along said second direction; and a second mount for holding the wafer, wherein the light from the light source projects an image of the mask pattern through said first lens, said phase-shift filter, said second lens, and onto the wafer, forming on the wafer an image that is substantially equal to the derivative of the intensity of a light image representing the mask pattern.

2. The semiconductor photolithography system of claim 1, wherein the light source, the mask, the center of said first focusing lens, said phase-shift filter, the center of said second focusing lens, and the wafer are all aligned along an optical axis.

3. The semiconductor photolithography system of claim 1, wherein said phase shifter produces a phase shift substantially equal to $\pi/2$ when light passes through said phase shifter.

4. The semiconductor photolithography system of claim 1, wherein said attenuator produces a phase shift substantially equal to $\pi$ in a region of said plate ranging from the center of said plate to one side of said plate.

5. A photolithography system for use in conjunction with a light source, a photolithography mask having a mask pattern, and a semiconductor wafer to project a light image of the mask pattern onto the wafer, comprising:

a single focusing lens having a predetermined focal length;

a first mount for holding the mask, said first mount positioned between the light source and said single focusing lens, and the distance between said first mount and said single focusing lens is greater than said predetermined focal length;

a phase-shift filter for modifying the amplitude and phase of light passing through said phase-shift filter according to a predetermined pattern, said phase-shift filter positioned away from said single focusing lens at a distance substantially equal to said predetermined focal length; and a second mount for holding the wafer, the distance between said second mount an said single focusing lens being greater than said predetermined focal length, wherein a mask pattern image is projected through said single focusing lens, said phase-shift filter, and onto the wafer mounted on said second mount;

wherein said phase-shift filter modifies said mask pattern image in the spatial frequency domain, generating an image on the wafer having a light intensity pattern that is substantially equal to the derivative of the light intensity pattern of said mask pattern image.

6. The photolithography system of claim 5, wherein the light source, the mask, the said focusing lens, said phase-shift filter, and the wafer are all aligned along the optical axis of said focusing lens.

7. The photolithography system of claim 5, wherein said phase-shift filter comprises an attenuator and a phase shifter, said attenuator having opacity that varies along a direction perpendicular to said optical axis, and said phase shifter modifying the phase of light passing through said phase shifter by an amount substantially equal to $\pi/2$.

8. The photolithography system of claim 5, wherein the distance between said phase-shift filter and the wafer is greater than 1000 times the smallest line width of the mask pattern.

9. A semiconductor photolithography system comprising:

a light source for emitting light;

a focusing lens having a predetermined focal length;

a photolithography mask having a mask pattern and situated between said light source and said focusing lens, the distance between said mask and said focusing lens being greater than the focal length of said focusing lens;

a phase-shift filter having a coating with varying opacity in different regions of said phase-shift filter, said phase-shift filter situated away from said focusing lens at a distance substantially equal to said predetermined focal length; and a wafer situated away from said lens at a distance greater than said predetermined focal length such that when the light from said light source passes through said mask, said focusing lens, said phase-shift filter, and onto said wafer, a clear image of said mask pattern is projected onto said wafer.

10. The system of claim 9, wherein the opacity of said phase-shift filter varies gradually from opaque to transparent along a predetermined direction.

11. A photolithography system for projecting an image of a mask pattern of a reticle mask onto a semiconductor wafer, comprising:

a light source; and an optical unit having in sequential order and aligned along a central axis: a first mount for holding the reticle mask, a first focusing lens with its optical axis aligned to said central axis, a phase-shift filter having varying opacity along a plane perpendicular to said central axis, a second focusing lens with its optical axis aligned to said central axis, and a second mount for holding the wafer;

wherein said phase-shift filter comprises an attenuator and a phase shifter, said attenuator being a transparent plate having a coating thereon of varying opacity, such that the opacity of said attenuator varies gradually from opaque to semi-transparent to transparent according to a predetermined pattern, and said coating being uniform along a first direction on the surface of said plate, and changing opacity along a second direction on the surface of said plate, said phase-shift filter being opaque at the center of said plate along said second direction, and gradually becoming transparent toward the edges of said plate along said second direction; and wherein light from said light source projects a mask pattern image through said first focusing lens, said phase-shift filter, said second focusing lens, and onto the wafer, said phase-shift filter modifying the phase and intensity pattern of said mask pattern image in the spatial frequency domain, performing the equivalent of a derivation on the light intensity pattern of the mask pattern image, thereby forming a sharp image that is substantially identical to a replica of the mask pattern on the wafer.

12. The photolithography system of claim 11, wherein the light source is an ultraviolet light source.

13. The photolithography system of claim 11, wherein said transparent plate is made of quartz.

14. A photolithography system for use in conjunction with a light source, a photolithography mask having a mask pattern, and a semiconductor wafer to project a light image of the mask pattern onto the wafer, comprising:

a focusing lens having a predetermined focal length;

a first mount for holding the mask, said first mount positioned between the light source and said focusing lens, and the distance between said first mount and said focusing lens is greater than said predetermined focal length;

a phase-shift filter for modifying the amplitude and phase of light passing through said phase-shift filter according to a predetermined pattern, said phase-shift filter comprising a first plate having a predetermined refractive index and a predetermined thickness such that light passing though said phase-shift filter has a phase shift substantially equal to $\pi/2$, and being positioned away from said focusing lens at a distance substantially equal to said predetermined focal length; and a second mount for holding the wafer, the distance between said second mount and said focusing lens being greater than said predetermined focal length, wherein a mask pattern image is projected through said lens, said phase-shift filter, and onto the wafer mounted on said second mount;

wherein said phase-shift filter modifies said mask pattern image in the spatial frequency domain, generating an image on the wafer having a light intensity pattern that is substantially equal to the derivative of the light intensity pattern of said mask pattern image.

15. The photolithography system of claim 14, wherein the light source, the mask, the said focusing lens, said phase-shift filter, and the wafer are all aligned along the optical axis of said focusing lens.

16. The photolithography system of claim 14, wherein said phase-shift filter comprises an attenuator and a phase shifter, said attenuator having opacity that varies along a direction perpendicular to said optical axis, and said phase shifter modifying the phase of light passing through said phase shifter by an amount substantially equal to $\pi/2$.

17. The photolithography system of claim 14, wherein the distance between said phase-shift filter and the wafer is greater than 1000 times the smallest line width of the mask pattern.

18. A semiconductor photolithography system comprising:

a light source for emitting light;

a focusing lens having a predetermined focal length;

a photolithography mask having a mask pattern and situated between said light source and said focusing lens, the distance between said mask and said focusing lens being greater than the focal length of said focusing lens;

a phase-shift filter comprising a first plate having a predetermined refractive index and a predetermined thickness such that light passing though said phase-shift filter has a phase shift substantially equal to $\pi/2$, and having a coating with varying opacity in different regions of said phase-shift filter, said phase-shift filter situated away from said focusing lens at a distance substantially equal to said predetermined focal length; and a wafer situated away from said lens at a distance greater than said predetermined focal length such that when the light from said light source passes through said mask, said focusing lens, said phase-shift filter, and onto said wafer, a clear image of said mask pattern is projected onto said wafer.

19. The system of claim 18, wherein the opacity of said phase-shift filter varies gradually from opaque to transparent along a predetermined direction.

20. The system of claim 18, wherein said phase-shift filter further comprises a second plate having a predetermined refractive index and a predetermined thickness such that light passing though said phase-shift filter has a phase shift substantially equal to $3\pi/2$ for half of the region of said phase-shift filter.

* * * * *

UNITED STATES PATENT AND TRADEMARK OFFICE
CERTIFICATE OF CORRECTION

PATENT NO. : 6,507,389 B1
DATED : January 14, 2003
INVENTOR(S) : Yeh et al.

It is certified that error appears in the above-identified patent and that said Letters Patent is hereby corrected as shown below:

<u>Title page,</u>
Item [75], Inventor, please insert -- Walter Teng, Taipei (TW) --.

<u>Column 7,</u>
Liune 32, please delete "be" and insert -- between --.
Line 52, please delete "costing" and insert -- coating --.

<u>Column 8,</u>
Line 30, please delete "an" and insert -- and --.

Signed and Sealed this

Thirty-first Day of August, 2004

JON W. DUDAS
*Director of the United States Patent and Trademark Office*